United States Patent
Fishburn et al.

(10) Patent No.: US 10,672,456 B2
(45) Date of Patent: Jun. 2, 2020

(54) THREE DIMENSIONAL MEMORY DEVICES

(71) Applicant: Micron Technology, Inc., Boise, ID (US)

(72) Inventors: Fredrick David Fishburn, Hiroshima (JP); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/282,868

(22) Filed: Feb. 22, 2019

(65) Prior Publication Data
US 2019/0267074 A1    Aug. 29, 2019

Related U.S. Application Data

(60) Provisional application No. 62/635,833, filed on Feb. 17, 2018.

(51) Int. Cl.
*G11C 11/4091*    (2006.01)
*G11C 11/406*    (2006.01)
(Continued)

(52) U.S. Cl.
CPC ...... *G11C 11/4091* (2013.01); *G11C 11/4094* (2013.01); *G11C 11/4097* (2013.01); *G11C 11/40607* (2013.01); *G11C 11/40622* (2013.01); *H01L 27/0688* (2013.01); *H01L 27/10805* (2013.01); *H01L 27/11* (2013.01)

(58) Field of Classification Search
None
See application file for complete search history.

(56) References Cited

U.S. PATENT DOCUMENTS

| 2004/0100852 A1* | 5/2004 | Scheuerlein | G11C 5/025 365/230.06 |
| 2012/0300529 A1 | 11/2012 | Narui | |

(Continued)

FOREIGN PATENT DOCUMENTS

WO    2019168752    9/2019

OTHER PUBLICATIONS

"International Application Serial No. PCT US2019 019144, International Search Report dated Jun. 12, 2019", 3 pgs.

(Continued)

*Primary Examiner* — James G Norman
(74) *Attorney, Agent, or Firm* — Schwegman Lundberg & Woessner, P.A.

(57) ABSTRACT

Systems and methods using a three-dimensional memory device with a number of memory cells disposed vertically in a number of pillars arranged along a horizontal direction can be used in a variety of applications. In various embodiments, pillars of memory cells may be disposed between lower and upper digitlines respectively coupled to different sense amplifiers to provide read/write operations and refresh operations. In various embodiments, a three-dimensional memory device having an array of memory cells vertically arranged in pillars may include a sense amplifier and digitline with a static random access memory cache, where the static random access memory cache is disposed below the array of memory cells in the same die. Additional apparatus, systems, and methods are disclosed.

20 Claims, 11 Drawing Sheets

(51) Int. Cl.
*H01L 27/108* (2006.01)
*G11C 11/4094* (2006.01)
*G11C 11/4097* (2006.01)
*H01L 27/06* (2006.01)
*H01L 27/11* (2006.01)

(56) References Cited

U.S. PATENT DOCUMENTS

| | | |
|---|---|---|
| 2015/0041885 A1 | 2/2015 | Yoshida et al. |
| 2016/0141303 A1 | 5/2016 | Kono |
| 2016/0350230 A1 | 12/2016 | Murphy |
| 2017/0271341 A1 | 9/2017 | Tanaka et al. |

OTHER PUBLICATIONS

"International Application Serial No. PCT US2019 019144, Written Opinion dated Jun. 12, 2019", 4 pgs.

* cited by examiner

US 10,672,456 B2

THREE DIMENSIONAL MEMORY DEVICES

PRIORITY APPLICATION

This application claims the benefit of priority under 35 U.S.C. 119(e) from U.S. Provisional Application Ser. No. 62/635,833, filed 27 Feb. 2018, which application is incorporated herein by reference in its entirety.

BACKGROUND

The electronics industry is under constant pressure to both reduce component size as well as power requirements and has a market driven need to improve operation of memory devices. One approach to reduce component size is to fabricate devices in a three-dimensional (3D) configuration. 3D memory technology, using pillar access devices and other methods, is evolving in the memory industry. Use of 3D technology enables higher density for the memory array core of a memory device with memory cells arranged vertically. For example, a memory device, such as a dynamic random access memory (DRAM), can be arranged as a stack of memory cells vertically on a substrate. As the memory array core of a DRAM is being arranged as a vertical stack for die size scaling and cost saving, the number of sense amplifiers (sense amps) is not increasing. This lack of sense amps for the vertical arrangement will hurt the refresh performance of the memory cells of the memory array. With a standard sense amp servicing multi-vertical array cores, the access to the vertical array cores becomes limited. In essence, the sense amps of the DRAM are being diluted. Improvements to 3D memories can be addressed by advances in design of the memory devices.

DETAILED DESCRIPTION

Figure 1:
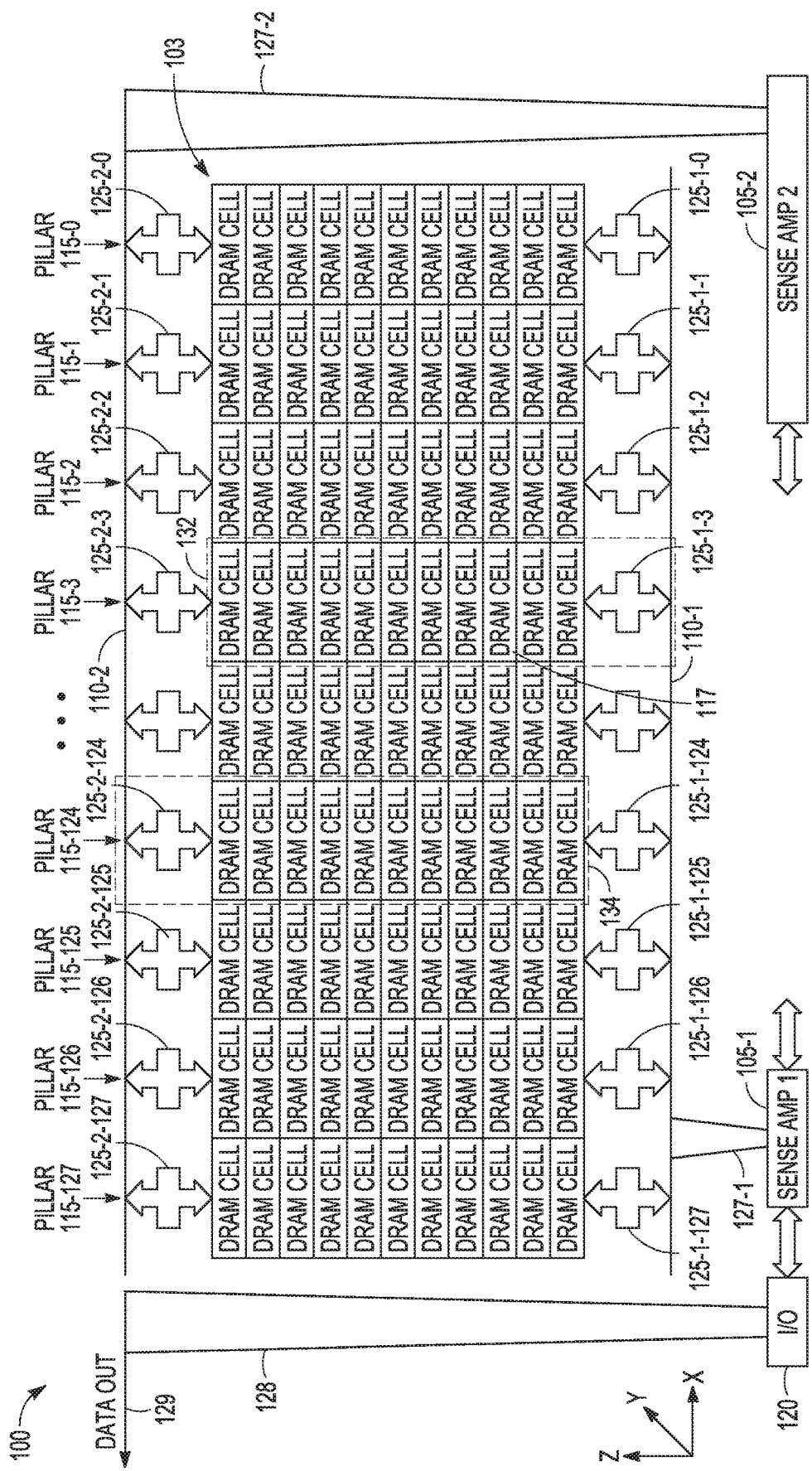
FIG. 1 is an illustration of features of an example three-dimensional dynamic random access memory including an array of memory cells arranged in a number of vertical pillars along a horizontal direction, according to various embodiments.

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, an additional set of sense amps can be implemented in 3D DRAMs to service an increase in vertical array stacks over conventional structures. Constructing an additional set of sense amps with their own access path to the stack array cores can address the issue of diluted sense amps and increase array performance. A first set of sense amps can service the customer needs with respect to accessing memory cells of the memory array for read and write operations and a second set can service the refresh parameters of the memory cells. As the design of array stacks for a DRAM increases, the importance of the additional sense amps will increase. In the structures, as taught herein, while a DRAM stack is being internally serviced, a user, such as an external processor, can access DRAM stacks or refresh other vertical DRAM stacks.

Besides adding a second set of sense amps, for each array core level a multiplexing (mux) device can be implemented to select between which set of sense amps to use. With a mux device, ping-pong logic can be used. In a ping pong logic technique, while a first sense amp is driving data out, a second sense amp can be pre-fetching data. So once the first sense amp is finished driving data out, a jump can be made to the second sense amp, which will start pumping out data while the first sense amp can start reloading. So in essence, the process is jumping between two sense amps like a ping pong. In addition to the first set of sense amps coupled to an input/output (I/O) interface, the second set of sense amps can have a different I/O interface associated with the second set. Structures having a second set of sense amps, as taught herein, can increase array accessibility and refresh performance, along with reducing refresh time intervals. Two sense amps, each of which can connect to different segments in a memory array hierarchy, can be implemented to enable accessing different parts of the memory array at the same time.

For a first set of sense amps in a DRAM structure, a first set of select devices can be coupled to a lower digitline connected to the first set of sense amps. A digitline can also be referred to as a data line. An example of a data line in a memory device is a bit line. For a second set of sense amps in the DRAM structure, a second set of select devices can be coupled to an upper digitline connected to the second set of sense amps. Vertical digitline segments can be connected from bottoms of vertical pillars to the first sense amp and/or from tops of the virtual pillars to the second sense amp. The select devices of the first and second sets are isolation (ISO) devices, which can isolate vertical digitline segments from lower and upper digitlines, respectively.

In order to enable 3D DRAMs for lower cost, higher density and scalability thin film access devices can be used. Leakage in such devices can be 10 to a 100 times that of single crystal silicon (Si). So frequent refresh can be used, and this impacts system overhead to output data. Furthermore, in a hierarchical digitline with 16K bits per sense amp, this arrangement further increases overhead to refresh the memory array. With a second set of digitline/sense amps, memory cells of the die can be refreshed continuously, if appropriate, while other memory cells of the die are available for read/writes. Such a refresh can be conducted 50 times more frequent than currently performed in a conventional system having a main memory with 16K bits per sense amp, and a hundred times more frequent with 8K bits per/sense amp, etc. An arrangement with a second set of digitline/sense amps can also be used for independent data flow with a second set of I/O and datapaths.

In various embodiments, a 3D DRAM can include a hierarchical data line architecture with built-in static random access memory (SRAM) cache under the memory array of the 3D DRAM. The built-in SRAM cache can be implemented for high bandwidth to eliminate need for process on-chip level three (L3) cache. A L3 cache is a cache that works together with a level one (L1) cache and a level two (L2) cache to improve performance by preventing bottlenecks due to the fetch and execute cycle taking too long. The L3 cache feeds information to the L2 cache, which then forwards information to the L1 cache. Typically, memory performance of the L3 cache is slower compared to L2 cache, but is still faster than the main memory (RAM).

In various embodiments, data can be read from a 3D DRAM into an underlying SRAM in the same die, and can be written back to the 3D DRAM. For example, data can be read from the 3D DRAM into an underlying SRAM at 10 petabps, can be written back to the 3D DRAM at 5-10 Petabps for 20 ns read and 40 ns write cycle times. SRAM data can be ported out through a sense amp and an I/O interface of the 3D DRAM. The underlying SRAM can be implemented under the memory array of the 3D DRAM in "free" space in the die under the memory array. The DRAM and associated SRAM can share data lines and sense amp.

FIG. 1 is an illustration of features of an embodiment of an example three-dimensional DRAM 100 including an array 103 of memory cells arranged in a number of vertical pillars 115-0, 115-1, 115-2, 115-3 . . . 115-124, 115-125, 115-126, and 115-127 along a horizontal direction. Memory cells are stacked vertically in each of these pillars with each memory cell, such as a DRAM cell, in a respective pillar coupled to a pillar digitline in the respective pillar. A pillar digitline is a digitline that runs in and along a pillar to which DRAM cells of the respective pillar are coupled. Though, in FIG. 1, 128 pillars are indicated along the horizontal direction, x, more or less than 128 pillars cart be implemented. Though eleven DRAM cells are shown in each pillar column in the vertical direction, z, more or less than eleven DRAM cells can be implemented. For example, DRAM 100 can include, but is not limited to, 128 DRAM cells in each pillar of 128 pillars per digitline line along the horizontal direction. A DRAM cell at each vertical level in a pillar is part of a tier, where a DRAM having 128 DRAM cells in each pillar has 128 tiers. Along the y direction, pillars of stacked memory cells can be structured along the direction x.

DRAM 100 can include a first digitline 110-1, which is a conductive structure, disposed in the x direction below, with respect to the z direction, array 103. First digitline 110-1 can be coupled to each pillar of the pillars 115-0, 115-1, 115-2, 115-3 . . . 115-125, 115-126, and 115-127 along the horizontal direction by a first select device 125-1-0, 125-1-1, 125-1-2, 125-1-3 . . . 125-1-124, 125-1-125, 125-1-126, and 125-1-127, respectively. These select devices are lower select devices in the z direction of the 3D structure and may be realized by transistors. DRAM 100 can include a second digitline 110-2, which is a conductive structure, disposed in the x direction above, with respect to the z direction, array 103. Second digitline 110-2 can be coupled to each pillar of the pillars 115-0, 115-1, 115-2, 115-3 . . . 115-2-124, 115-125, 115-126, and 115-127 along the horizontal direction by a second select device 125-2-0, 125-2-1, 125-2-2, 125-2-3 . . . 125-2-124, 125-2-125, 125-2-126, and 125-2-127, respectively. These select devices are upper select devices in the z direction of the 3D structure and may be realized by transistors.

A first sense amp 105-1 can be coupled to first digitline 110-1 by a via 127-1. A second sense amp 105-2 can be coupled to second digitline 110-2 by a via 127-2. An I/O circuit 120 coupled to first sense amplifier 105-1 or second sense amplifier 105-2, though I/O circuit coupled to first sense amplifier 105-1 is shown in FIG. 1. I/O circuit 120 can be coupled to provide data to a data out path 129 using a via 128. In an embodiment, first sense amp 105-1 coupled to I/O 120, which is coupled to the data out path 129, can be used with read operations and write operations to array 103 with respect to a host device such as a host processor, and second sense amp 105-2 can be used with internal control circuitry to refresh memory cells of array 103. In this arrangement, the host processor can operate with little or no impact by the refresh. Control circuitry, separate from the host processor, can operate to control the refresh of memory cells such that host operations to a memory cell not being refreshed can be conducted in time intervals that overlap with the refresh, which can reduce system overhead. In addition, with the two sets of select devices, two digitlines, and two sense amps, cells in different pillars can be refreshed in parallel.

Consider the following non-limiting example in which a DRAM cell 117 in column 132 of DRAM cells in pillar 115-3 can be selected to read from or write to DRAM cell 117. DRAM cells in column 134 of DRAM cells in pillar 115-125 can be selected to be refreshed. Upper select device 125-2-124 can be selected for refresh and lower select device 125-1-3 can be selected for the read or write operation. Selection of upper select device 125-2-124 enables sequential row addressing in column 134 for refreshing, for example vertically downward as shown by the arrow, to connect to second sense amp 105-2 by digitline 120-2 and via 127-2. Selection of lower select device 125-1-3 enables reading from or writing to memory cell 117 from sense amp 105-1 using via 127-1 and digitline 110-1.

With upper select devices and second digitline 110-2 on top of array 103 coupled to second sense amp 105-2, cells on different pillars can be refreshed in parallel. With respect to limits on how long it will take to refresh the whole array 103 of a memory die, consider 2.5 μs to pull bits from a pillar. Assuming in worst case that an external user, such as a host processor, is only accessing a few pillars continuously. In an example of 128 pillars, to refresh all bits on all 128 pillars would take 2.5 μs*128 pillar=0.32 ms. It can take 0.3 msec for a DRAM cell to drop 0.3 V with 5 fF cell capacitance and access device leakage of less than 25 pA. With refresh a hundred time worse, array 103 can still be kept refreshed, transparent to operation of the die. Refresh may not be an issue, since all bits on a pillar cart be refreshed within 2.5 μsec, otherwise digitline segment (pillar digitline) is at an equalization (EQ). With 128 pillars coupled to a sense amplifier via a digitline and 128 bits per pillar, there can be 128 pillars×128 bits/pillar=16K bits per sense amplifier. With two sense amps and two digitlines, there are 8K bits per sense amp. At such levels, digitline capacitance of such a 3D DRAM would be about ½ that of a planar DRAM.

Figure 2:
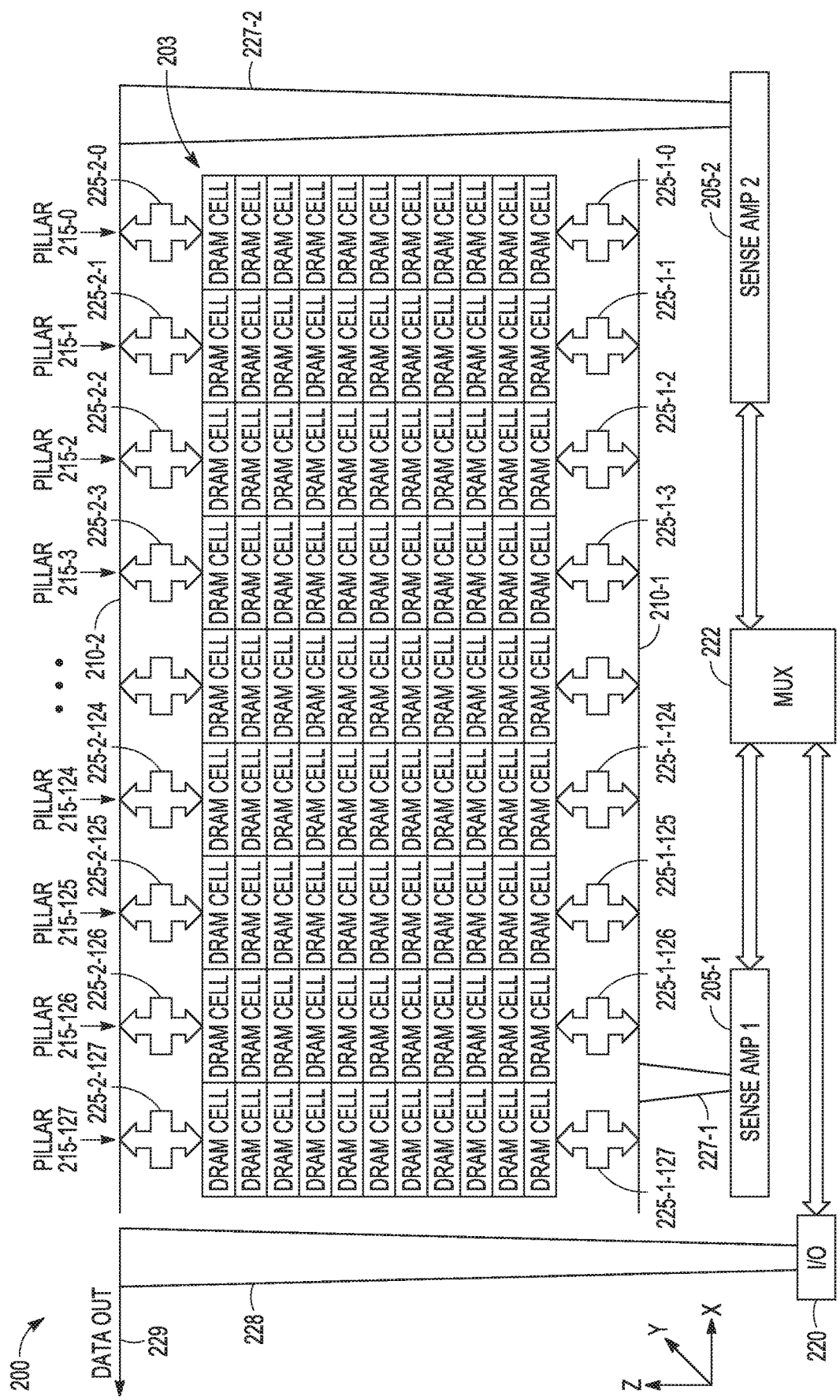
FIG. 2 is an illustration features of an example three-dimensional dynamic random access memory including an array of memory cells arranged in a number of vertical pillars along a horizontal direction, according to various embodiments.

FIG. 2 is an illustration of features of an embodiment of an example three-dimensional DRAM 200 including an array 203 of memory cells arranged in a number of vertical pillars 215-0, 215-1, 215-2, 215-3 . . . 215-124, 215-125, 215-126, and 215-127 along a horizontal direction. Memory cells are stacked vertically in each of these pillars with each memory cell, such as a DRAM cell, in a respective pillar coupled to a pillar digitline in the respective pillar. Though 128 pillars are indicated along the horizontal direction, x, more or less than 128 pillars can be implemented. Though eleven DRAM cells are shown in each pillar column in the vertical direction, z, more or less than eleven DRAM cells can be implemented. For example, DRAM 200 can include, but is not limited to, 128 DRAM cells in each pillar of 128 pillars per digitline line along the horizontal direction, which provides a DRAM having 128 tiers. Along the y direction, pillars of stacked memory cells can be structured along the direction x. Various features of DRAM 200 can be implemented similar to features of DRAM 100 of FIG. 1.

DRAM 200 can include a first digitline 210-1, which is a conductive structure, disposed in the x direction below, with respect to the z direction, array 203. First digitline 210-1 can be coupled to each pillar of the pillars 215-0, 215-1, 215-2, 215-3 . . . 215-125, 215-126, and 215-127 along the horizontal direction by a first select device 225-1-0, 225-1-2, 225-1-2, 225-1-3 . . . 225-1-124, 225-1-125, 225-1-126, and 225-1-127, respectively. These select devices are lower select devices in the z direction of the 3D structure and may be realized by transistors. DRAM 200 can include a second digitline 210-2, which is a conductive structure, disposed in the x direction above array 203 in the z direction. Second digitline 210-2 can be coupled to each pillar of the pillars 215-0, 215-1, 215-2, 215-3 . . . 215-124, 215-125, 215-126, and 215-127 along the horizontal direction by a second select device 225-2-0, 225-2-1, 225-2-2, 225-2-3 . . . 225-2-124, 225-2-125, 225-2-126, and 225-2-127, respectively. These select devices are upper select devices in the z direction of the 3D structure and may be realized by transistors.

A first sense amp 205-1 can be coupled to first digitline 210-1 by a via 227-1. A second sense amp 205-2 can be coupled to second digitline 210-2 by a via 227-2. Both first sense amp 205-1 and second sense amp 205-2 can be coupled to multiplexer (mux) 222, which allows both first sense amp 205-1 and second sense amp 205-2 to be used for accessing a memory cell of array 203 for read or write operations and to be used to refresh memory cells of array 203. Mux 222 can be coupled to I/O circuit 220. Though mux 222 is shown in FIG. 2 as being between first sense amp 205-1 and second sense amp 205-2, other arrangements of mux 222, first sense amp 205-1, and second sense amp 205-2 can be implemented. For example, mux 222 can be located between I/O circuit 220 and first sense amp 205-1.

Mux 222 can be configured to select first sense amp 205-1 or second sense amp 205-2 to provide data to I/O circuit 220 to output the data on the data out path 229 using via 228 that couples I/O circuit 220 to the data out path 229. With selection of first sense amplifier 205-1 or second sense amplifier 205-2, selection of one of first select device 225-1-0, 225-1-2, 225-1-2, 225-1-3 . . . 225-1-124, 225-1-125, 225-1-126, and 225-1-127 and/or one of second select device 225-2-0, 225-2-1, 225-2-2, 225-2-3 . . . 225-2-124, 225-2-125, 225-2-126, and 225-2-127 can be used to make a selection of the digitline 210-1 (lower path) or digitline 210-2 (upper path) to function in read/write operations for a host processor or in refresh operations. Mux 222 can operate to vary the functions of first sense amplifier 205-1 and digitline 210-1 and second sense amplifier 205-2 and digitline 210-2 at different times, effectively as a function of time. In this arrangement, the host processor can operate with little or no impact by the refresh. Control circuitry, separate from the host processor, can operate to control the refresh of memory cells such that host operations to a memory cell not being refreshed can be conducted in time intervals that overlap with the refresh, which can reduce system overhead. In addition, with the two sets of select devices, two digitlines, and two sense amps, cells in different pillars can be refreshed in parallel.

Figure 3:
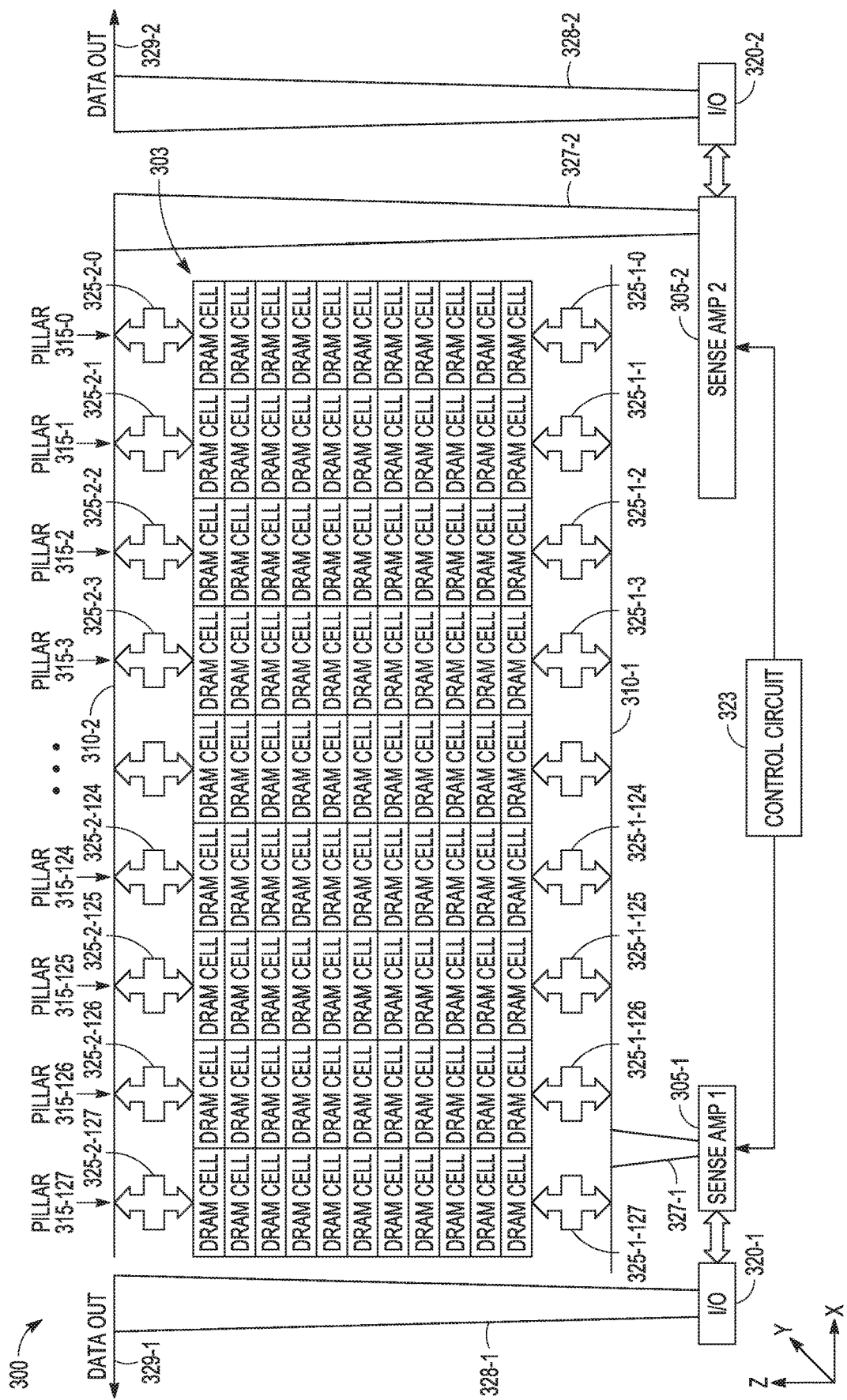
FIG. 3 is an illustration of features of an example three-dimensional dynamic random access memory including an array of memory cells arranged in a number of vertical pillars along a horizontal direction, according to various embodiments.

FIG. 3 is an illustration of features of an embodiment of an example three-dimensional DRAM 300 including an array 303 of memory cells arranged in a number of vertical pillars 315-0, 315-1, 315-2, 315-3 . . . 315-124, 315-125, 315-126, and 315-127 along a horizontal direction. Memory cells are stacked vertically in each of these pillars with each memory cell, such as a DRAM cell, in a respective pillar coupled to a pillar digitline in the respective pillar. Though 128 pillars are indicated along the horizontal direction, x, more or less than 128 pillars can be implemented. Though eleven DRAM cells are shown in each pillar column in the vertical direction, z, more or less than eleven DRAM cells can be implemented. For example, DRAM 300 can include, but is not limited to, 128 DRAM cells in each pillar of 128 pillars per digitline line along the horizontal direction, which provides a DRAM having 128 tiers. Along the y direction, pillars of stacked memory cells can be structured along the direction x. Various features of DRAM 300 can be implemented similar to features of DRAM 100 of FIG. 1 and/or DRAM 200 of FIG. 2.

DRAM 300 can include a first digitline 310-1, which is a conductive structure, disposed in the x direction below, with respect to the z direction, array 303. First digitline 3104 can be coupled to each pillar of the pillars 315-0, 315-1, 315-2, 315-3 . . . 315-124, 315-125, 315-126, and 315-127 along the horizontal direction by a first select device 325-1-0, 325-1-2, 325-1-2, 325-1-3 . . . 325-1-124, 325-1-125, 325-1-126, and 325-1-127, respectively. These select devices are lower select devices in the z direction of the 3D structure and may be realized by transistors. DRAM 300 can include a second digitline 310-2, which is a conductive structure, disposed in the x direction above array 303 in the z direction.

Second digitline 310-2 can be coupled to each pillar of the pillars 315-0, 315-1, 315-2, 315-3 . . . 315-124, 315-125, 315-126, and 315-127 along the horizontal direction by a second select device 325-2-0, 325-2-1, 325-2-2, 325-2-3 . . . 325-2-124, 325-2-125, 375-2-126, and 325-2-127, respectively. These select devices are upper select devices in the z direction of the 3D structure and may be realized by transistors.

A first sense amp 305-1 can be coupled to first digitline 310-1 by a via 327-1. First sense amp 305-1 can be coupled to I/O circuit 320-1 that is coupled to a via 328-1 to provide data to a data out path 329-1. A second sense amp 305-2 can be coupled to second digitline 310-2 by a via 327-2. Second sense amp 305-2 can be coupled to I/O circuit 320-2 that is coupled to a via 328-2 to provide data to a data out path 329-2. Both first sense amp 305-1 and second sense amp 305-2 can be coupled to control circuit 323, which allows both first sense amp 305-1 and second sense amp 305-2 to be used for accessing a memory cell of array 303 for read or write operations and to be used to refresh memory cells of array 303. Though control circuit 323 is shown in FIG. 3 as being between first sense amp 305-1 and second sense amp 305-2, other arrangements of control circuit 323, first sense amp 305-1, and second sense amp 305-2 can be implemented. For example, control circuit 323 can be located in another part of the die on which first sense amp 305-1 and second sense amp 305-2 are constructed with array 303 or, alternatively, external to the die with control lines routed to first sense amp 305-1 and second sense amp 305-2.

Control circuit 323 can be configured to select first sense amp 305-1 to provide data to I/O circuit 3204 to output the data on the data out path 329-1 using via 328-1 that couples I/O circuit 320-1 to the data out path 329-1 or to select second sense amp 305-2 to provide data to I/O circuit 320-2 to output the data on the data out path 329-2 using via 328-2 that couples I/O circuit 320-2 to the data out path 329-2. Data out path 329-1 and data out path 329-2 can be routed to a common data output node of DRAM 300 with control circuit 323 regulating which of data out path 329-1 or data out path 329-2 provides the data to the data output node by controlling output of first sense amp 305-1 and second sense amp 305-2, or alternatively controlling output of I/O circuit 320-1 and I/O circuit 320-2. With selection of first sense amplifier 305-1 or second sense amplifier 305-2, selection of one of first select device 325-1-0, 325-1-2, 325-1-2, 325-1-3 . . . 325-1-124, 325-1-125, 325-1-126, and 325-1-127 and/or one of second select device 325-2-0, 325-2-1, 325-2-2, 325-2-3 . . . 325-2-124, 325-2-125, 325-2-126, and 325-2-127 can be used to make a selection of the digitline 310-1 (lower path) or digitline 310-2 (upper path) to function in read/write operations for a host processor or in refresh operations. Control circuit 323 can operate to vary the functions of first sense amplifier 305-1 and digitline 310-1 and second sense amplifier 327-2 and digitline 310-2 at different times, effectively as a function of time. In this arrangement, the host processor can operate with little or no impact by the refresh. Control circuitry, separate from the host processor, can operate to control the refresh of memory cells such that host operations to a memory cell not being refreshed can be conducted in time intervals that overlap with the refresh, which can reduce system overhead. In addition, with the two sets of select devices, two digitlines, and two sense amps, cells in different pillars can be refreshed in parallel.

Figure 4:
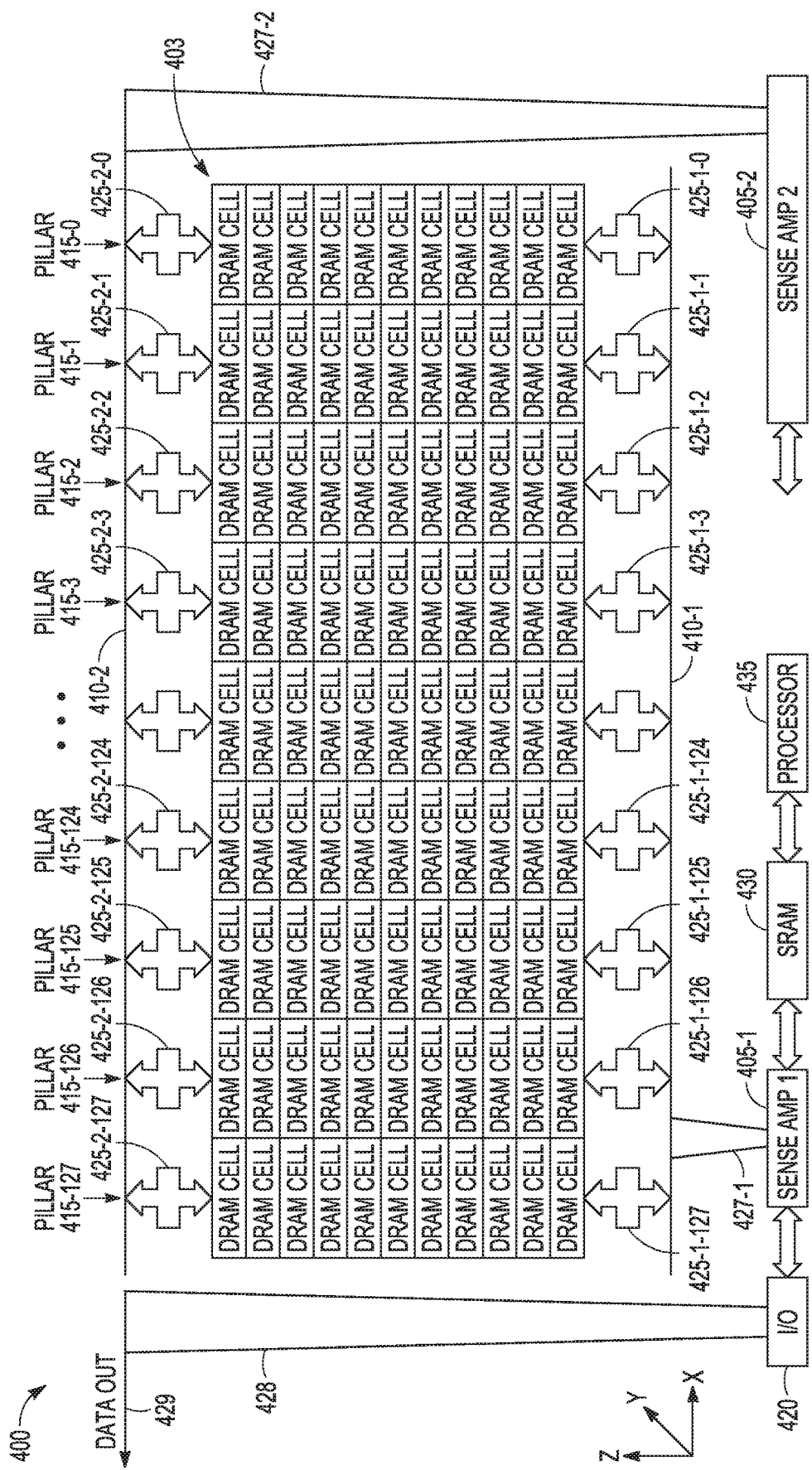
FIG. 4 is an illustration of features of an example three-dimensional dynamic random access memory including an array of memory cells arranged in a number of vertical pillars along a horizontal direction, according to various embodiments.

FIG. 4 is an illustration of features of an embodiment of an example three-dimensional DRAM 400 including an array 403 of memory cells arranged in a number of vertical pillars 415-0, 415-1, 415-2, 415-3 . . . 415-124, 415-125, 415-126, and 415-127 along a horizontal direction. Memory cells are stacked vertically in each of these pillars with each memory cell, such as a DRAM cell, in a respective pillar coupled to a pillar digitline in the respective pillar. Though 128 pillars are indicated along the horizontal direction, x, more or less than 128 pillars can be implemented. Though eleven DRAM cells are shown in each pillar column in the vertical direction, z, more or less than eleven DRAM cells can be implemented. For example, DRAM 400 can include, but is not limited to, 128 DRAM cells in each pillar of 128 pillars per digitline line along the horizontal direction, which provides a DRAM having 128 tiers. Along the y direction, pillars of stacked memory cells can be structured along the direction x. Various features of DRAM 400 can be implemented similar to features of DRAM 100 of FIG. 1, DRAM 200 of FIG. 2, and/or DRAM 300 of FIG. 3.

DRAM 400 can include a first digitline 410-1, which is a conductive structure, disposed in the x direction below, with respect to the z direction, array 403. First digitline 410-1 can be coupled to each pillar of the pillars 415-0, 415-1, 415-2, 415-3 . . . 415-124, 415-125, 415-126, and 415-127 along the horizontal direction by a first select device 425-1-0, 425-1-2, 425-1-2, 425-1-3 . . . 425-1-124, 425-1-125, 425-1-126, and 425-1-127, respectively. These select devices are lower select devices in the z direction of the 3D structure and may be realized by transistors. DRAM 400 can include a second digitline 410-2, which is a conductive structure, disposed in the x direction above array 403 in the z direction. Second digitline 410-2 can be coupled to each pillar of the pillars 415-0, 415-1, 415-2, 415-3 . . . 415-124, 415-125, 415-126, and 415-127 along the horizontal direction by a second select device 425-2-0, 425-2-1, 425-2-2, 425-2-3 . . . 425-2-124, 425-2-125, 425-2-126, and 425-2-127, respectively. These select devices are upper select devices in the z direction of the 3D structure and may be realized by transistors.

A first sense amp 405-1 can be coupled to first digitline 410-1 by a via 427-1. First sense amp 405-1 can be coupled to I/O circuit 420-1 that is coupled to a via 428 to provide data to a data out path 429. First sense amp 405-1, in conjunction with digitline 410-1 and selection of appropriate ones of first select device 425-1-0, 425-1-2, 425-1-2, 425-1-3 . . . 425-1-124, 425-1-125, 425-1-126, and 425-1-127 can be used in read/write operations to array 403. Second sense amp 405-2 can be coupled to second digitline 410-2 by a via 427-2, and can be implemented to perform refresh operations of array 403 using second digitline 410-2.

DRAM 400 can include a static random access memory (SRAM) 430 structured to store bits from DRAM cells of array 403, where SRAM 430 is integrated in the die with array 403. SRAM 430 can be structured below array 403. SRAM 430 may be configured as a SRAM cache that can store N bits from the DRAM cells of array 403, error-correcting code (ECC) data, or other data. DRAM 400 can also include a processor 435 disposed in the die below array 403 to control SRAM 430. In addition to or as an alternative to processor 435 disposed in the die below array 403, DRAM 400 can include complementary metal-oxide-semiconductor (CMOS) circuits under array 403, control circuits under array 403, logic circuits under array 403, or other circuits under array 403 integrated in the same die with array 403.

In operation, each row of array 403 can be sequentially addressed with a select device of the upper select devices 425-2-0, 425-2-1, 425-2-2, 425-2-3 . . . 425-2-124, 425-2-125, 425-2-126, and 425-2-127 activated to couple a pillar digitline of a respective pillar to second sense amp 405-2 via upper digitline 410-2 and via 427-2 for refresh. A select device of the lower select devices 425-1-0, 425-1-1, 425-1-2, 425-1-3 . . . 425-1-124, 425-1-125, 425-1-126, and 425-1-127 can be activated to couple a pillar digitline of a respective pillar to first sense amp 405-1 via lower digitline 410-1 and via 427-1 for read/write operations. Other variations of coupling to sense amp 405-1 and/or sense amp 405-2 can be implemented.

Bits on a pillar (dataline segment) can be read into SRAM 430 or data in SRAM 430 can be ported out through sense amp 405-1 to I/O 420. In addition with SRAM 430 used as a cache in read/write operations for memory array 403 of DRAM 400, before new cache page load is loaded into SRAM 430, the old page in SRAM 430 can be stored back to array 403 of DRAM 400. SRAM 430 may be implemented in read-modify-write operations with DRAM or other DRAM only access operations. A read-modify-write operation is an operation that reads a memory location and writes a new value into it simultaneously.

A 360 nm×360 nm cell pillar footprint of a 3D DRAM would allow one SRAM cell per 2 pillars in 45 nm logic. In an architecture having 128 tiers with 128 pillars per digitline or 64 tiers with 64 pillars per digitline means that there is sufficient SRAM capacity under array 403 to store any one pillar per sense amplifier in SRAM 430, for example. For a 16 Gb DRAM with a 256 Mb SRAM or a 32 Gb DRAM with a 512 Mb SRAM, SRAM cache 430 may be loaded in 64 or 128 cycles of 20 ns each. This means 32 or 64 bits per sense amplifier (128 Mb or 256 Mb on a die) can be buffered, while 64 or 128 bits are refreshed in 2.5 μs. For a $10^{+14}$ bps maximum, assuming a 32 Mb SRAM cache, this can be greater than 10 Petabps.

A processor-in-memory (PIM) architecture can be implemented in an integrated 3D DRAM topography such as shown in FIG. 4. The space in the die under array 403 provides a mechanism for constructing a processor in the memory die. This can lead to a high performance system memory. Other circuitry can be located under array 403 integrated in the same die of DRAM 400.

Figure 5:
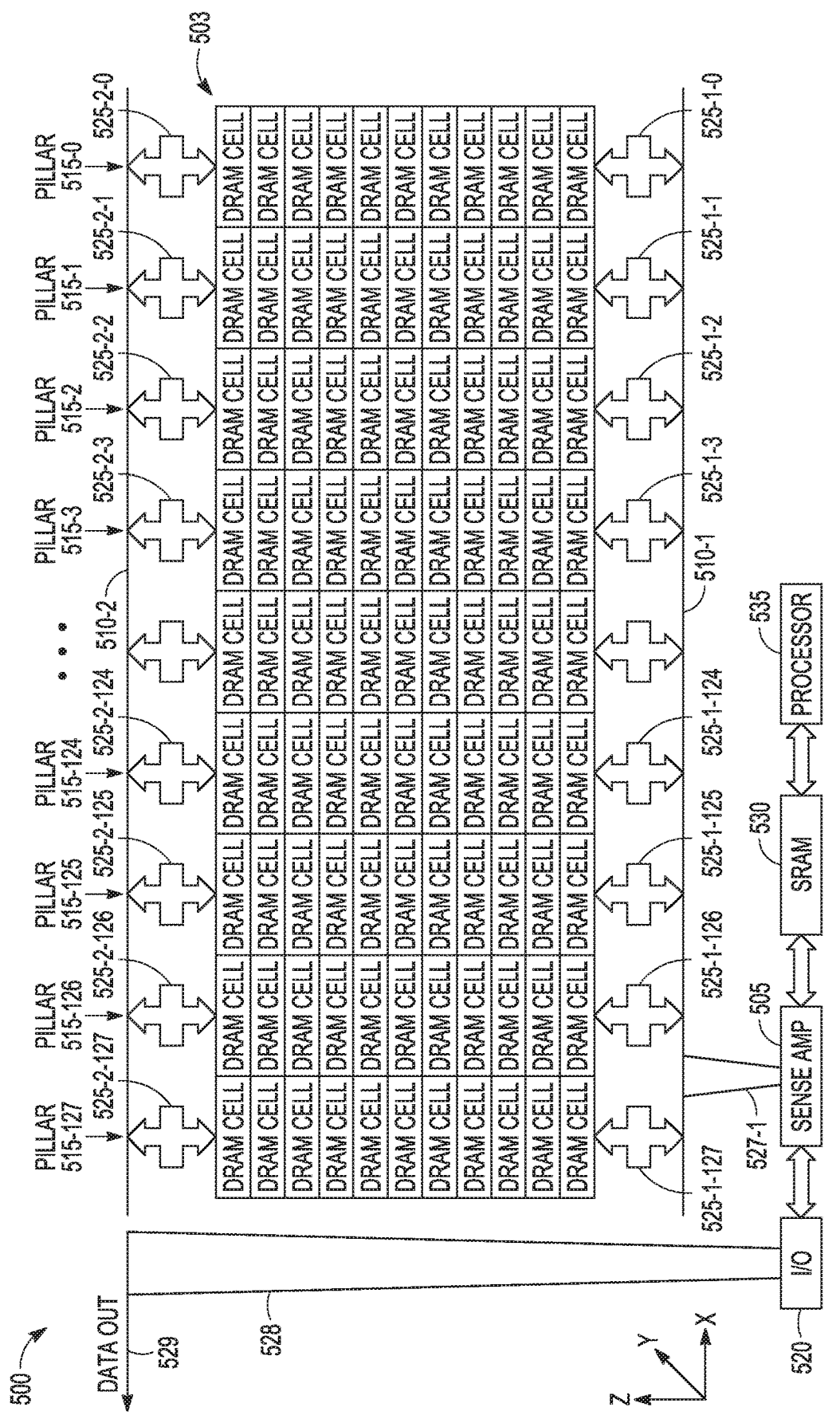
FIG. 5 is an illustration of features of an example three-dimensional dynamic random access memory including an array of memory cells arranged in a number of vertical pillars along a horizontal direction, according to various embodiments.

FIG. 5 is an illustration of features of an embodiment of an example three-dimensional DRAM 500 including an array 503 of memory cells arranged in a number of vertical pillars 515-0, 515-1, 515-2, 515-3 . . . 515-124, 515-125, 515-126, and 515-127 along a horizontal direction. Memory cells are stacked vertically in each of these pillars with each memory cell, such as a DRAM cell, in a respective pillar coupled to a pillar digitline in the respective pillar. Though 128 pillars are indicated along the horizontal direction, x, more or less than 128 pillars can be implemented. Though eleven DRAM cells are shown in each pillar column in the vertical direction, z, more or less than eleven DRAM cells can be implemented. For example, DRAM 500 can include, but is not limited to, 128 DRAM cells in each pillar of 128 pillars per digitline line along the horizontal direction, which provides a DRAM having 128 tiers. Along the y direction, pillars of stacked memory cells can be structured along the direction x. Various features of DRAM 500 can be implemented similar to features of DRAM 100 of FIG. 1, DRAM 200 of FIG. 2, DRAM 300 of FIG. 3, and/or DRAM 400 of FIG. 4.

DRAM 500 can include a first digitline 510-1, which is a conductive structure, disposed in the x direction below, with respect to the z direction, array 503. First digitline 510-1 can be coupled to each pillar of the pillars 515-0, 515-1, 515-2, 515-3 . . . 515-124, 515-125, 515-126, and 515-127 along the horizontal direction by a first select device 525-1-0, 525-1-2, 525-1-2, 525-1-3 . . . 525-1-124, 525-1-125, 525-1-126, and 525-1-127, respectively. These select devices are lower select devices in the z direction of the 3D structure and may be realized by transistors. DRAM 500 can include a second digitline 510-2, which is a conductive structure, disposed in the x direction above array 503 in the z direction. Second digitline 510-2 can be coupled to each pillar of the pillars 515-0, 515-1, 515-2, 515-3 . . . 515-124, 515-125, 515-126, and 515-127 along the horizontal direction by a second select device 525-2-0, 525-2-1, 525-2-2, 525-2-3 . . . 525-2-124, 525-2-125, 525-2-126, and 525-2-127, respectively. These select devices are upper select devices in the z direction of the 3D structure and may be realized by transistors. Second digitline 510-2 can be coupled to other control circuitry of DRAM 500.

A sense amp 505 can be coupled to first digitline 510-1 by a via 527-1. Sense amp 505 can be coupled to I/O circuit 52( )that is coupled to a via 528 to provide data to a data out path 529. Sense amp 505, in conjunction with digitline 510-1 and selection of appropriate ones of first select device 525-1-0, 525-1-2, 525-1-2, 525-1-3 . . . 525-1-124, 525-1-125, 525-1-126, and 525-1-127 and appropriate ones of second select device 525-2-0, 525-2-1, 525-2-2, 525-2-3 . . . 525-2-124, 525-2-125, 525-2-126, and 525-2-127 can be used in read/write operations to array 503.

DRAM 500 can include a static random access memory (SRAM) 530 structured to store bits from DRAM cells of array 503, where SRAM 530 is integrated in the die with array 503. SRAM 530 can be structured below array 503. SRAM 530 may be configured as a SRAM cache that can store N bits from the DRAM cells of array 503, error-correcting code (ECC) data, or other data. SRAM 530 can be arranged as a SRAM cache that shares digitline 510-1 and sense amp 505 with array 503. DRAM 500 can also include a processor 535 disposed in the die below array 503 to control SRAM 530. In addition to or as an alternative to processor 535 disposed in the die below array 503, DRAM 500 can include complementary metal-oxide-semiconductor (CMOS) circuits under array 503, control circuits under array 503, logic circuits under array 503, or other circuits under array 503 integrated in the same die with array 503.

In operation, a row of array 503 can be addressed by an access line coupled to the respective row, with a select device of the upper select devices 525-2-0, 525-2-1, 525-2-2, 525-2-3 . . . 525-2-124, 525-2-125, 525-2-126, and 525-2-127 activated to tipper digitline 510-2. A select device of the lower select devices 525-1-0, 525-1-1, 525-1-2, 525-1-3 . . . 525-1-124, 525-1-125, 525-1-126, and 525-1-127 can be activated to couple a pillar digitline of the respective pillar to sense amp 505 via lower digitline 510-1 and via 527-1 for read/write operations.

Bits on a pillar (dataline segment) can be read into SRAM 530 or data in SRAM 530 can be ported out through sense amp 505 to I/O 520. In addition with SRAM 530 used as a cache in read/write operations for memory array 503 of DRAM 500, before new cache page load is loaded into SRAM 530, the old page in SRAM 530 can be stored back to array 503 of DRAM 500. DRAM 500 can be arranged to read data from array 503 into SRAM cache 530 and to write the data hack to array 503. DRAM 500 may be operable at rates to read the data from the array 503 into SRAM cache 530 at approximately 10 petabps and write the data hack to the array in an interval from about 5 petabps to about 10 petabps. SRAM 530 may be implemented in read-modify-write operations with DRAM or other DRAM only access operations.

A processor-in-memory (PIM) architecture can be implemented in an integrated 3D DRAM topography such as shown in FIG. 5. The space in the die under array 503 provides a mechanism for constructing a processor in the memory die. This can lead to a high performance system memory. Other circuitry can be located under array 503 integrated in the same die of DRAM 500.

Figure 6A:
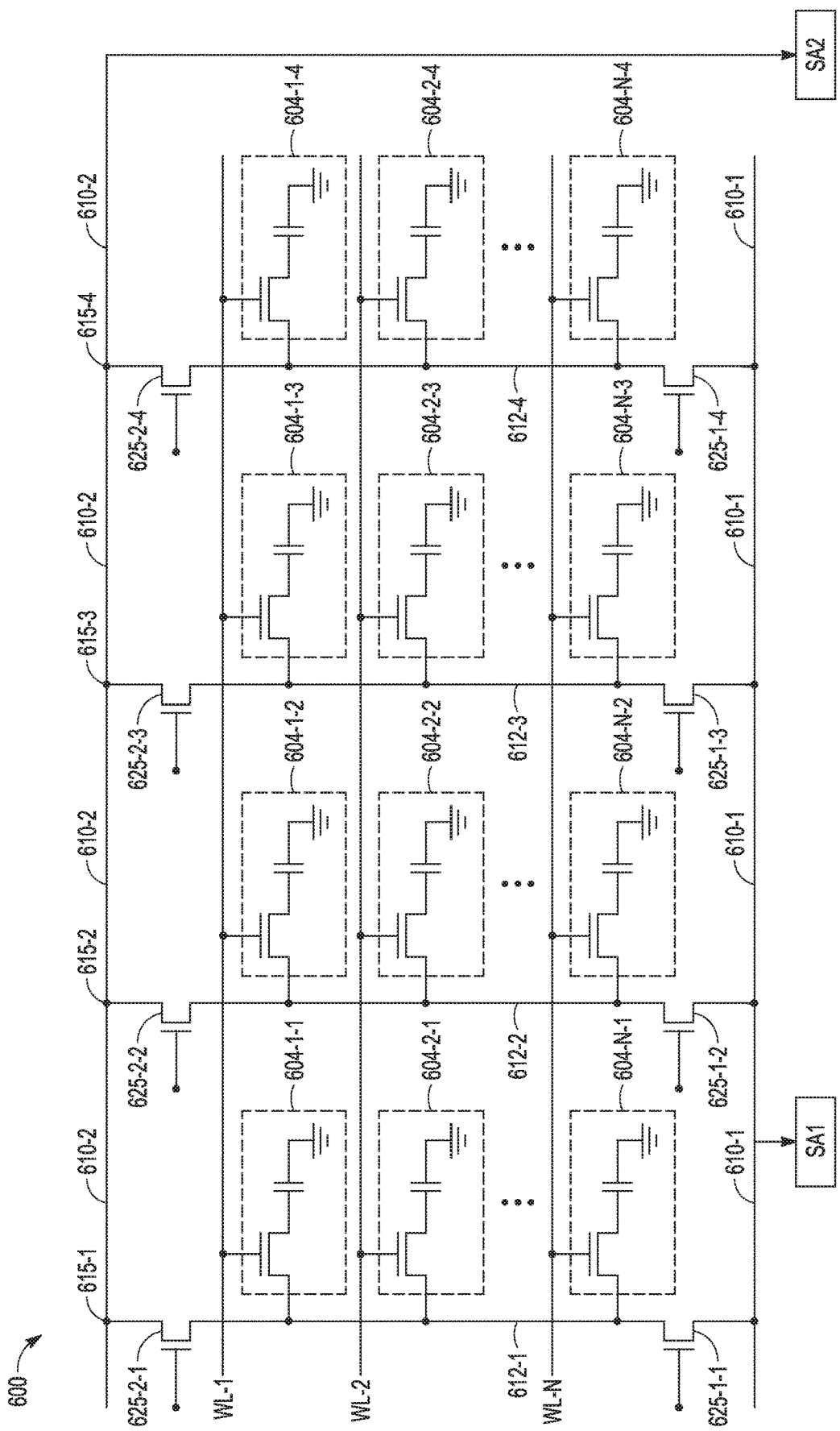
FIG. 6A is a schematic representation of an example two-dimensional portion of a three-dimensional dynamic random access memory, according to various embodiments.

FIG. 6A is a schematic representation of an embodiment of an example 2D portion 600 of a 3D DRAM. Shown in FIG. 6 are access lines WL-1, WL-2 . . . WL-N, which represents a 3D DRAM with N equal to the number of tiers of the 3D DRAM. Access lines WL-1, WL-2 . . . WL-N can be viewed as being in a WL Group 1, where additional groups can be realized as copies of WL Group 1. For example, a 3D DRAM can be structured with 16, 32 or 64 copies of the 2D portion 600. Though FIG. 6A only shows four pillars 615-1, 615-2, 615-3, and 615-4, 2D portion 600 can be structured with more or less than four pillars. Coupled to access line WL-1 are DRAM cells 604-1-1, 604-1-2, 604-1-3, and 604-1-4 coupled to vertical pillar digitline 612-1 in pillar 615-1, vertical pillar digitline 612-2 in pillar 615-2, vertical pillar digitline 612-3 in pillar 615-3, and vertical pillar digitline 612-4 in pillar 615-4, respectively. Coupled to access line WL-2 are DRAM cells 604-2-1, 604-2-2, 604-2-3, and 604-2-4 coupled to vertical pillar digitline 612-1 in pillar 615-1, vertical pillar digitline 612-2 in pillar 615-2, vertical pillar digitline 612-3 in pillar 615-3, and vertical pillar digitline 612-4 in pillar 615-4, respectively. Coupled to access line WL-N are DRAM cells 604-N-1, 604-N-2, 604-N-3, and 604-N-4 coupled to vertical pillar digitline 612-1 in pillar 615-1, vertical pillar digitline 612-2 in pillar 615-2, vertical pillar digitline 612-3 in pillar 615-3, and vertical pillar digitline 612-4 in pillar 615-4, respectively.

Each DRAM cell can include an access transistor coupled to a capacitor. The access transistor may be realized by a metal-oxide-semiconductor (MOS) transistor. The capacitor is used to store charge representative of data, and the transistor, to which the capacitor is coupled, provides operative coupling to a respective pillar digitline 612-$i$, which is a conductive structure, for reading and writing of data with respect to the capacitor. A DRAM cell is not limited to a MOS transistor-capacitor arrangement, but may be implemented by an active device that can control access to a storage device that can maintain, at appropriate refresh rates, and change upon appropriate stimulus a state representative of data.

Each set of DRAM cells 604-$i$-1, 604-$i$-2 . . . 604-$i$-N, for i=1 to 4, can be coupled to an access line WL-1, WL-2 . . . WL-N, respectively, which access line provides a control line to the access device of the respective DRAM cell. The access lines WL-1, WL-2 . . . WL-N may be word lines, for example. Pillar digitlines 612-1, 612-2, 612-3, and 612-4, running vertically along its respective pillar, can be coupled to a lower digitline 610-1 by select ISO transistors 625-1-1, 625-1-2, 625-1-3 and 625-1-4, respectively, and coupled to a upper digitline 610-2 by select ISO transistors 625-2-1, 625-2-2, 625-2-3 and 625-2-4, respectively, for reading or writing of a selected DRAM cell. Lower digitline 610-1 is coupled to sense amplifiers SA1 and vertically displaced from upper digitline 610-2 that is coupled to sense amplifiers SA2. Control signals for access lines WL-1, WL-2 . . . WL-N and select transistors 625-1-$i$ and 625-2-$i$, for i=1 to 4 can be provided by control circuitry of the DRAM.

This architecture can allow for a DRAM with 128 pillars, or other number of pillars, along the direction of digitlines 610-1 and 610-2, which may be metal lines. Such an architecture can reduce the total number and area of sense amplifiers by enabling refresh in parallel to array access. Within a single WL group, as a portion of the memory array, while reading a DRAM cell, other rows within this same WL group cannot be refreshed, since they include a DRAM cell on the same pillar in the single WL group and share a common ISO device coupled to a first set of sense amplifiers SA1. For example, with DRAM cell 604-1-1 read out by activating WL-1, 625-1-1 and SA1, DRAM cells 604-2-$i$ may not be refreshed by using WL-2, 625-2-$i$ and SA2. However, bits on any of the other WL groups of 3D DRAM can be refreshed using a second set of sense amplifiers SA2.

Figure 6B:
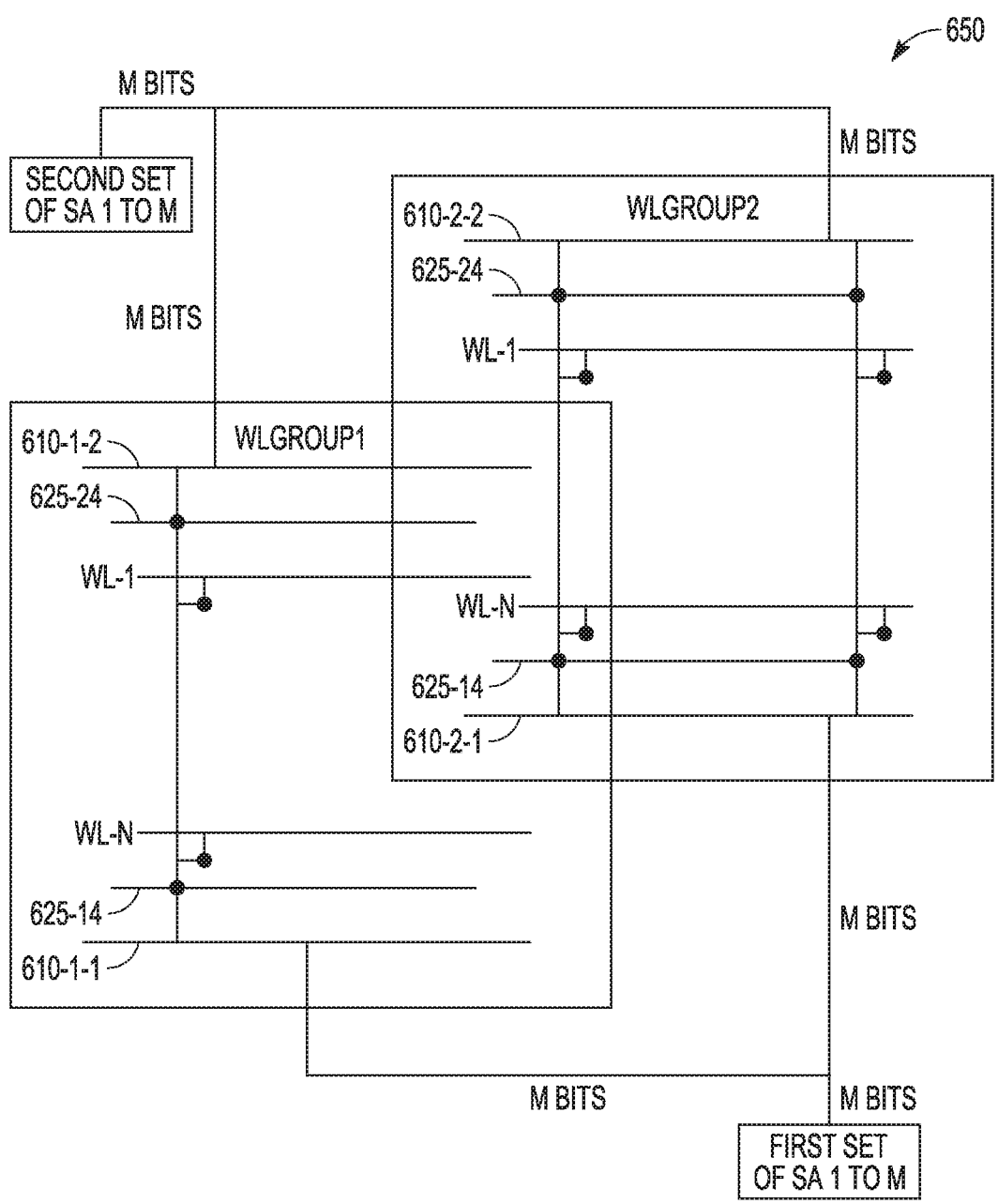
FIG. 6B is a circuit diagram of an example three-dimensional dynamic random access memory, according to various embodiments.

FIG. 6B is a circuit diagram of an embodiment of an example 3D-DRAM 650. Although FIG. 6B depicts only WL Group 1 and WL Group 2, other groups can be included in 3D-DRAM 650, for example, 16, 32 or 64 groups. Each set of SAs are shared with WL Group 1 and WL Group 2. In this example embodiment, each of WL Group 1 and WL Group 2 includes M pillars and N access lines. The 1 to M pillars are connected to respective SAs, 1 to M, via respective global digitlines.

WL Group 1 and WL Group 2 are structured similarly, with Group 1 having lower digitline 610-1-1 and upper digitline 610-1-2 and Group2 having lower digitline 610-2-1 and upper digitline 610-2-2. Each of WL Group 1 and WL Group 2 includes ISO transistors 625-14 coupled to its respective lower digitline and each of WL Group 1 and WL Group 2 includes ISO transistors 625-24 coupled to its respective upper digitline. ISO transistors 625-14 and 625-24 receive respective selection signal. With each group including M digitlines, each group has M number of SAs.

In a read sequence, for example, a selected access line, among WL-1 . . . WL-N in a selected WL Group, is activated by ACT command. Information of the multiple memory cells, which are connected to the selected access line, is transferred to respective digitlines at the same time. Then, sense amplifiers connected to the digitlines (e.g., first set of SAs) are activated by row control signal at the same time. Then, for example, in response to a read command, one of the activated sense amplifiers is selected and data in the selected sense amplifier is transferred to data amplifier by column select signals and column control signal.

In a refresh sequence, in response to a refresh command, a selected access line in a selected WL Group is activated to transfer information stored in the memory cells to respective digitlines. Then, the information on the digitlines is amplified by multiple sense amplifiers connected to the digitlines (e.g., second set of SAs) respectively. Then the information amplified by the SAs is rewritten into the same memory cells respectively. At this time, the column related signals are not activated.

For such read and refresh operations, M number of SAs, M number of digitlines, and M number of memory cells can be connected to one access line. The set of SAs can be shared with multiple WL Groups.

Figure 6C:
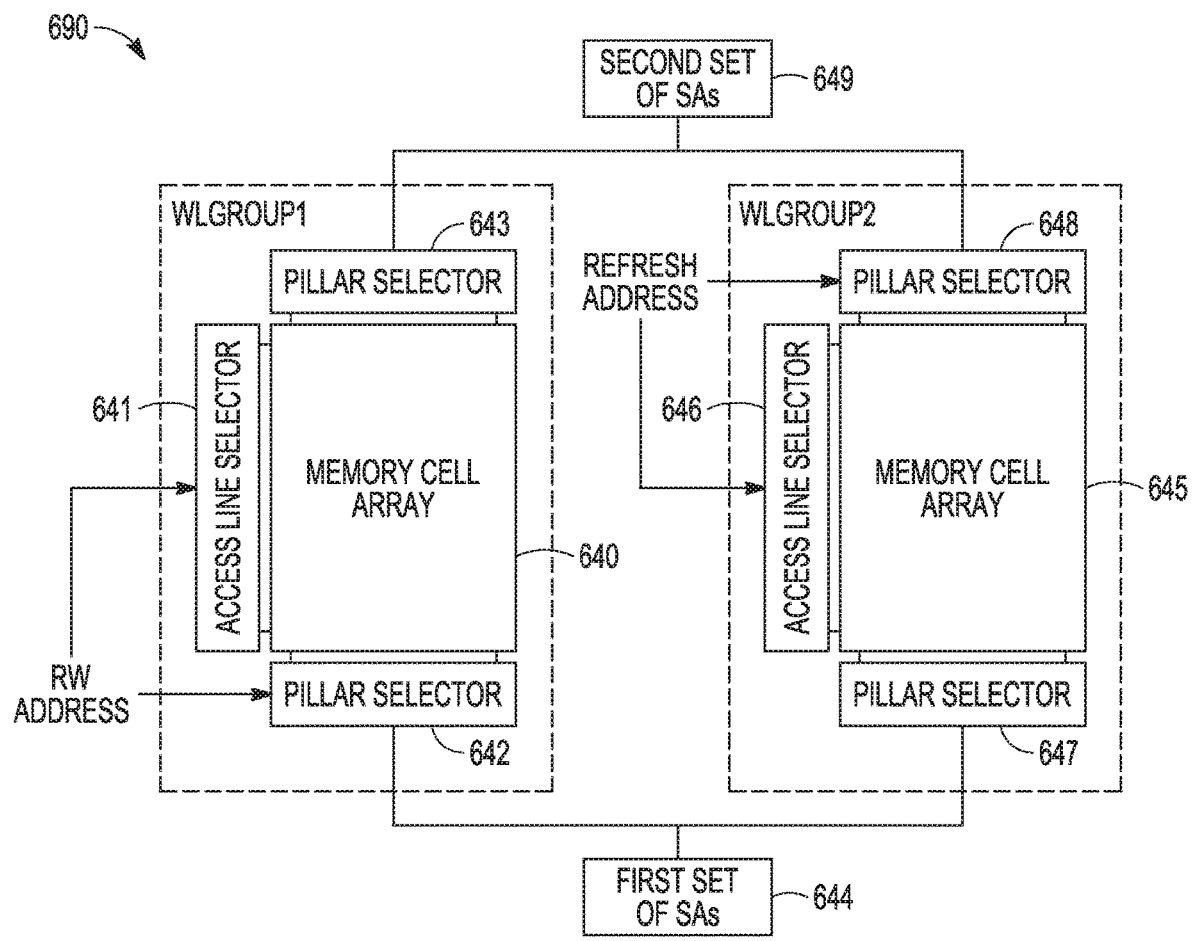
FIG. 6C shows an example of memory operation of an example three-dimensional dynamic random access memory, according to various embodiments.

FIG. 6C shows an embodiment of an example of memory operation of an example 3D DRAM 690. Shown in FIG. 6C are WL Group 1 and WL Group 2, though 3D DRAM 690 can have more than two WL groups. WL Group 1 can include a memory cell array 640 that is associated with an access line selector 641, pillar selector 642, and pillar selector 643. In a read (R) or write (W) operation to a memory cell in memory cell array 640, a R/W address is applied to access line selector 641 and pillar selector 642, which couples to a first set of SAs 644. WL Group 2 can include a memory cell array 645 that is associated with an access line selector 646, pillar selector 647, and pillar selector 648. In a refresh operation to a memory cell in memory cell array 645, a refresh address is applied to access line selector 646 and pillar selector 648, which couples to a second set of SAs 649.

Read and refresh operations can be conducted to WL Group 1 and WL Group 2 at the same time. For example, WL Group 1 is read based on a read address to output read data by using the first set of SAs 644. At the same time, WL Group2 is refreshed on based on refresh address by using the second set of SAs 648. The first set of SAs 644 is coupled to both pillar selector 642 and pillar selector 647, where control lines, including a RW address, to pillar selector 642 or pillar selector 647 can control use of the first set of SAs 644 by the respective pillar selector 642 or pillar selector 647 for read/write operations. The second set of SAs 649 is coupled to both pillar selector 643 and pillar selector 648, where control lines, including a refresh address, to pillar selector 643 or pillar selector 648 can control use of the second set of SAs 649 by the respective pillar selector 643 or pillar selector 647 for refresh operations.

Figure 7:
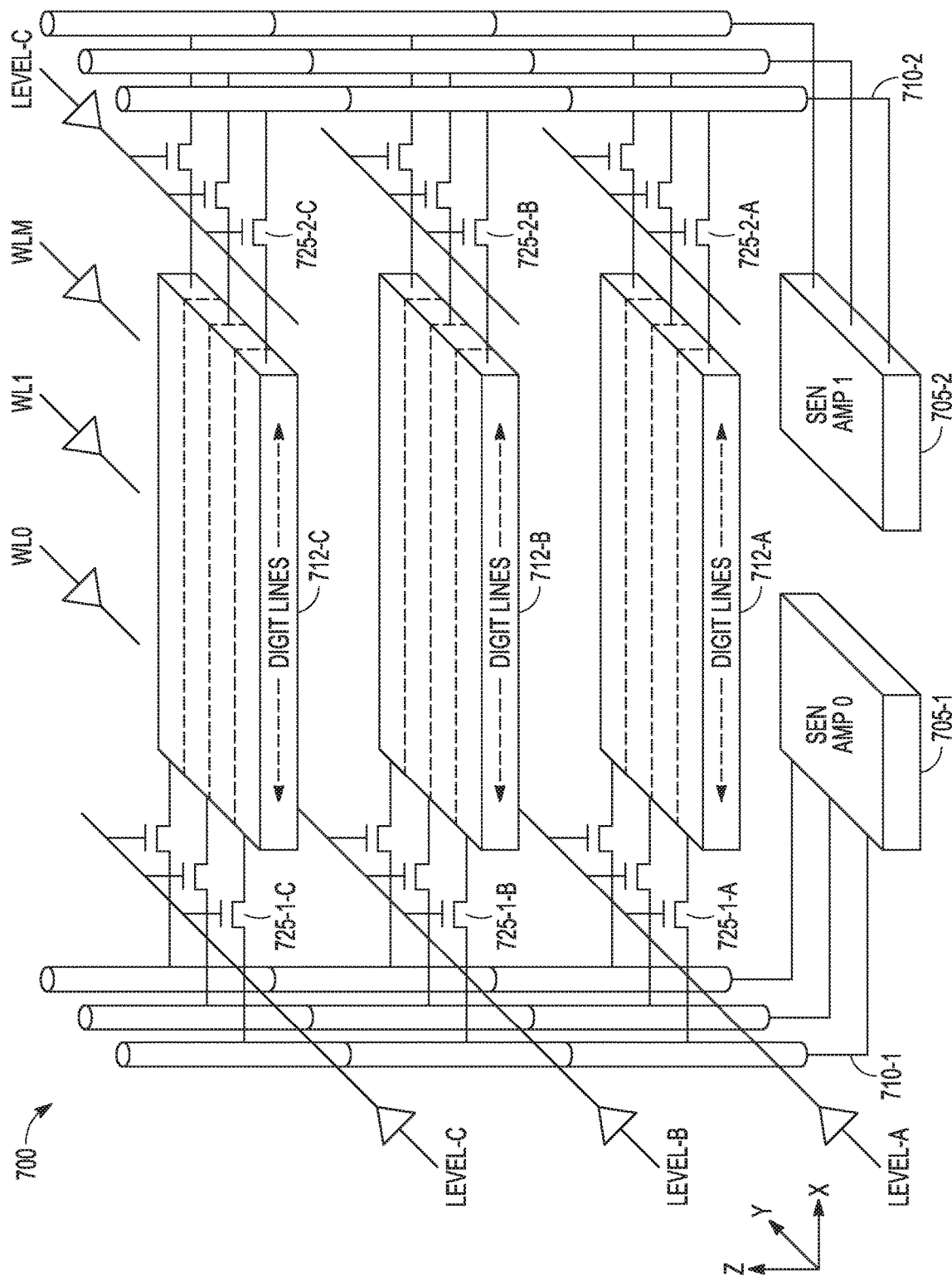
FIG. 7 is an illustration of features of an example three-dimensional dynamic random access memory arranged as a number of horizontal levels along a vertical direction, according to various embodiments.

FIG. 7 is an illustration of features of an embodiment of an example 3-D DRAM 700 arranged as a number of horizontal levels in the vertical direction. Though three horizontal planes Level-A, Level-B, and Level-C are shown, more or less that three horizontal planes may be implemented. For ease of presentation, the array of memory cells is not shown. Rather, sets of digit lines 712-A, 712-B, 712-C in Level-A, Level-B, and Level-C, respectively, are shown in which each digit line is coupled to a number of DRAM cells stacked horizontally. DRAM 700 can include a set of first digitlines 710-1, which are conductive structures, disposed in the z direction to couple to a set of first select devices 725-1-A, a set of first select devices 725-1-B, and a set of first select devices 725-1-C in Level-A, Level-B, and Level-C, respectively. These sets of select devices are at one end of corresponding sets of digit lines 712-A, 712-B, 712-C in Level-A, Level-B, and Level-C in the x direction of the 3D structure and may be realized by transistors.

DRAM 700 can include a set of second digitlines 710-2, which are conductive structures, disposed in the z direction. The set of second digitlines 710-2 can be coupled along the vertical direction to a set of second select devices 725-2-A, a set of second select devices 725-2-B, and a set of second select devices 725-2-C in Level-A, Level-B, and Level-C, respectively. These sets of select devices are at another end of corresponding sets of digit lines 712-A, 712-B, 712-C in Level-A, Level-B, and Level-C in the x direction of the 3D structure and may be realized by transistors. The set of second select devices 725-2-A, the set of second select devices 725-2-B, and the set of second select devices 725-2-C are opposite the set of first select devices 725-1-A, the set of first select devices 725-1-B, and the set of first select devices 725-1-C with respect to sets of digit lines 712-A, 712-B, 712-C in Level-A, Level-B, and Level-C, respectively.

A first sense amp 705-1 can be coupled to the set of first digitlines 710-1. A second sense amp 705-2 can be coupled to the set of second digitlines 710-2. In an embodiment, one of the first sense amp 705-1 or the second sense amp 705-2 can be used with internal control circuitry to read operations and write operations to memory cells coupled to selected ones of digit lines in the sets of digit lines 712-A, 712-B, 712-C with respect to a host device such as a host processor. In addition, the other one of the first sense amp 705-1 or the second sense amp 705-2 can be used with internal control circuitry to refresh memory cells coupled to selected ones of digit lines in the sets of digit lines 712-A, 712-B, 712-C. In this arrangement, the host processor can operate with little or no impact by the refresh. Control circuitry, separate from the host processor, can operate to control the refresh of memory cells such that host operations to a memory cell not being refreshed can be conducted in time intervals that overlap with the refresh, which can reduce system overhead. In addition, first sense amp 705-1 and second sense amp 705-2 can allow memory cells in different levels to be refreshed in parallel. Access to the memory cells can be implemented using selected access lines such as, but not limited to, access lines WL0, WL1, . . . WLM.

As can be seen from reviewing FIGS. 1-5, in the example 3-D DRAM 700, the digit lines including coupled DRAM memory cells are be structured in horizontal stacks instead of vertical stacks of DRAM memory cells of DRAMS of FIGS. 1-5. For ease of presentation, FIGS. 1-5 show one level of DRAM cells. Considering only level A and rotating the level ninety degrees counterclockwise, the rotated structure will be similar to the architectures associated with FIGS. 1-5. For ease of presentation, control circuitry is not shown in FIG. 7. Example 3-D DRAM 700 of FIG. 7 can be structured with circuitry of FIGS. 1-5 and may be modified to operate similar to the architectures of FIGS. 1-5 or similar architectures. Such horizontal arrangements of 3-D DRAM 700 can be operated in a manner to have the same benefits as the vertical arrangements of 3-D DRAMS associated with FIGS. 1-5.

Figure 8:
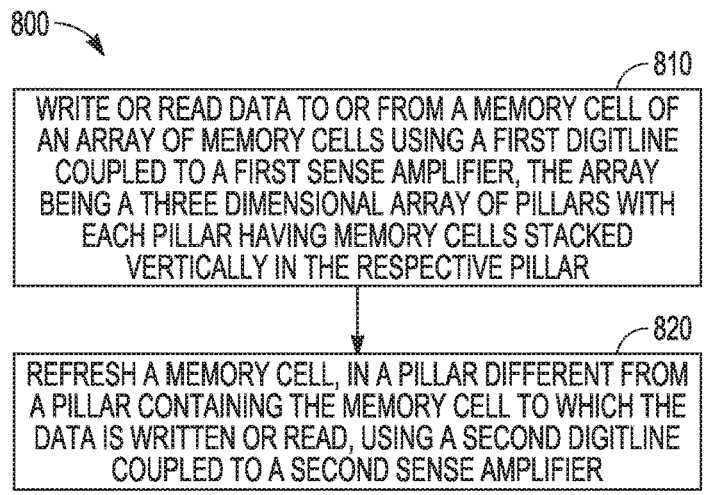
FIG. 8 is a flow diagram of an example method of accessing memory cells of a memory device, according to various embodiments.

FIG. 8 is a flow diagram of an embodiment of an example method 800 of accessing memory cells of a memory device. At 810, data is written to or read from a memory cell of an array of memory cells using a first digitline coupled to a first sense amplifier, the array being a three-dimensional array of pillars with each pillar having memory cells stacked vertically in the respective pillar. A number of the pillars can be arranged along a horizontal direction. At 820, a memory cell, in a pillar different from a pillar containing the memory cell to which the data is written or read, is refreshed using a second digitline coupled to a second sense amplifier. One of the first digitline and the second digitline is disposed below the array and the other of the first digitline and the second digitline is disposed above the array.

Variations of method 800 or methods similar to method 800 can include a number of different embodiments that may depend on the application of such methods and/or the architecture of systems in which such methods are implemented. Such methods can include continuously refreshing memory cells in pillars different from a pillar in which data is being read from or written to a memory cell. Writing or reading data can include reading one or more bits from one or more pillars of the array into a static random access memory disposed below the array of memory cells. Variations of method 800 or methods similar to method 800 can include storing a new cache page into a static random access memory cache disposed below the array of memory cells and, before loading the new page into the static random access memory cache, storing back to the array an existing page stored in the static random access memory cache.

In various embodiments, a memory device can comprise: an array of memory cells, the array being a three-dimensional array of pillars with each pillar having memory cells stacked vertically in the pillar, a number of the pillars arranged along a horizontal direction; a first digitline disposed below the array, the first digitline coupled to each pillar of the pillars along the horizontal direction by a respective first select device; a second digitline above the array, the second digitline coupled to each pillar of the pillars along the horizontal direction by a respective second select device; a first sense amplifier coupled to the first digitline; a second sense amplifier coupled to the second digitline; and an input/output circuit coupled to the first sense amplifier or the second sense amplifier.

Variations of such memory devices or similar memory devices can include a number of different embodiments that may depend on the application of such memory devices and/or the architecture of systems in which such memory devices are implemented. Such memory devices can include control circuitry to access a first memory cell in one pillar of the pillars along the horizontal direction via an access line coupled to the first memory cell and via one of the first digitline or the second digitline coupled to the one pillar and to access a second memory cell in another pillar of the pillars along the horizontal direction via an access line coupled to the second memory cell and via the other one of the first digitline or the second digitline. The control circuitry can be operable to control the access to the first memory cell and the access to the second memory cell in time intervals that overlap. Each of the memory cells in each pillar can be a DRAM cell coupled to a pillar digitline of the respective pillar, the pillar digitline coupled to the respective first select device and to the respective second select device of the respective pillar.

Variations of such memory devices or similar memory devices can include a number of different features. The memory device can include a SRAM structured to store a bit from a memory cell of each of a selected number of pillars of the pillars along the horizontal direction, where the SRAM is integrated in a die with the array of memory cells. The SRAM can be structured below the array of memory cells. The memory device can include a processor disposed in the die below the array of memory cells to control the static random access memory. Another feature can include the memory device having a second input/output circuit coupled to the first sense amplifier or the second sense amplifier not coupled to the input/output circuit.

Figure 9:
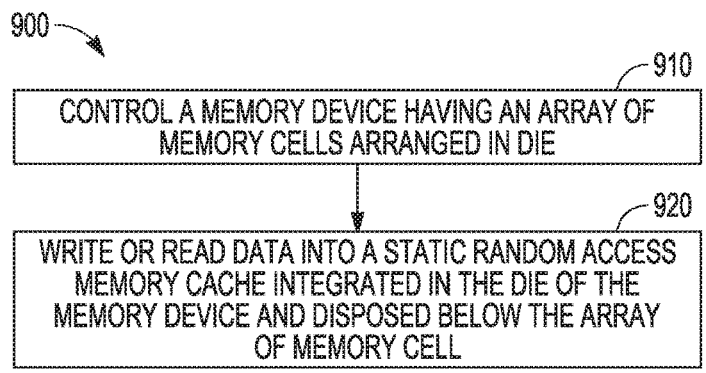
FIG. 9 is a flow diagram of an example method of operating a three-dimensional memory device, according to various embodiments.

FIG. 9 is a flow diagram of an embodiment of an example method 900 of operating a 3D memory device. At 910, a memory device having an array of memory cells arranged in a die is controlled. The array is a 3D array of pillars with each pillar having memory cells stacked vertically in the pillar, where a number of the pillars are arranged along a horizontal direction. At 920, data is written into or read from a SRAM cache integrated in the die of the memory device and disposed below the array of memory cells. The static random access memory cache and the array of memory cells can share a digitline and a sense amplifier coupled to the digitline to conduct storage operations.

Variations of method 900 or methods similar to method 900 can include a number of different embodiments that may depend on the application of such methods and/or the architecture of systems in which such methods are implemented. Such methods can include porting out the data from the static random access memory cache through the sense amplifier to input/output circuitry to transmit the data out of the memory device. Such methods can include storing a new cache page into the static random access memory cache and, before loading the new page into the static random access memory cache, storing back to the array an existing page stored in the static random access memory cache.

In various embodiments, a memory device can comprise: an array of memory cells in a die, the array being a three-dimensional array of pillars with each pillar having memory cells stacked vertically in the pillar, a number of the pillars arranged along a horizontal direction; a digitline disposed below the array or above the array, the digitline coupled to each pillar of the pillars along the horizontal direction by a respective select device coupled to a pillar digitline of the respective pillar; a SRAM cache integrated in the die with the array of memory cells and disposed below the array of memory cells; a sense amplifier coupled to the digitline; and an input/output circuit coupled to the sense amplifier. The array and the static random access memory cache can share the digitline and the sense amplifier.

Variations of such memory devices or similar memory devices can include a number of different embodiments that may depend on the application of such memory devices and/or the architecture of systems in which such memory devices are implemented. Such memory devices can include the respective memory device arranged to read data from the array into the static random access memory cache and to write the data back to the array. The memory device can be operable at rates to read the data from the array into the static random access memory cache at approximately 10 petabps and write the data back to the array in an interval from. about 5 petabps to about 10 petabps. The memory device can include a processor disposed in the die below the array of memory cells to control the static random access memory.

Figure 10:
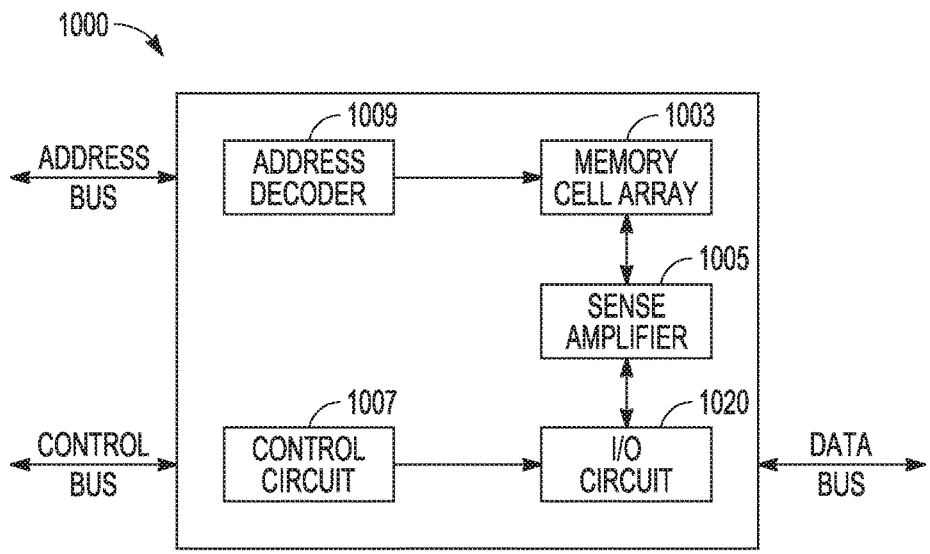
FIG. 10 is a block diagram of features of a dynamic random access memory in which three-dimensional structures of pillars of memory cells and associated structures can be structured, according to various embodiments.

FIG. 10 is a block diagram of features of a DRAM 1000 in which 3D structures of pillars of memory cells and associated structures, as taught herein, can be structured such as in accordance with, but not limited to, 3D DRAM structures of FIGS. 1-7. DRAM 1000 can include an address decoder 1009 and control circuit 1007 to operate with respect to a memory cell array 1003 to read and write memory cells of memory cell array 1003 using sense amplifiers 1005 and I/O circuit 1020. Other components of DRAM 1000 are not shown to focus on the example use of a 3D memory array of cells and associated sense amps in a vertical structure. In addition, address decoder 1009 can be coupled to an address bus, control circuit 1007 can be coupled to a control bus, and I/O circuitry 1020 can be coupled to a data bus.

Figure 11:
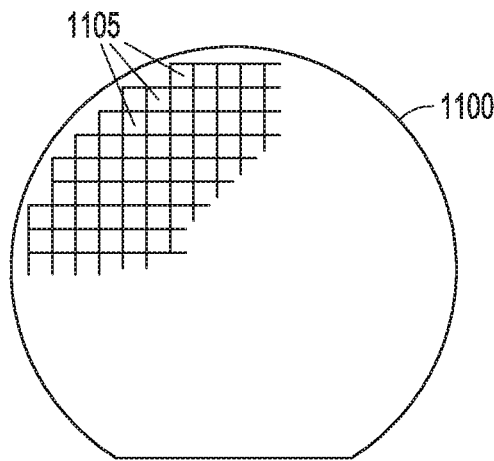
FIG. 11 illustrates an example of a wafer arranged to provide multiple electronic components including a memory device having a three-dimensional architecture, according to various embodiments.

FIG. 11 illustrates an example of a wafer 1100 arranged to provide multiple electronic components. Wafer 1100 can be provided as a wafer in which a number of dice 1105 can be fabricated. Alternatively, wafer 1100 can be provided as a wafer in which the number of dice 1105 have been processed to provide electronic functionality and are awaiting singulation from wafer 1100 for packaging. Wafer 1100 can be provided as a semiconductor wafer, a semiconductor on insulator wafer, or other appropriate wafer for processing electronic devices such as an integrated circuit chips. Wafer 1100 can be fabricated in accordance with forming devices, using conventional semiconductor manufacturing techniques, having structures as taught in an embodiment related to FIGS. 1-7 and 10.

Using various masking and processing techniques, each die 1105 can be processed to include functional circuitry such that each die 1105 is fabricated as an integrated circuit with the same functionality and packaged structure as the other dice on wafer 1100. Alternatively, using various masking and processing techniques, various sets of dice 1105 can be processed to include functional circuitry such that not all of the dice 1105 are fabricated as an integrated circuit with the same functionality and packaged structure as the other dice on wafer 1100. A packaged die having circuits integrated thereon providing electronic capabilities is herein referred to as an integrated circuit (IC).

Wafer 1100 can include memory devices, where each memory device is located in a die 1105. The memory die may be structured as a 3D memory device having a number of memory cells disposed in a number of pillars between lower and upper digitlines with sense amplifiers to provide read/write operations and refresh operations, arranged as taught herein, using conventional fabrication technologies and procedures. Examples of memory device located in a die 1105 may include an array of memory cells that share a sense amp and digitline with a SRAM cache formed below the array of memory cells in the same die.

Figure 12:
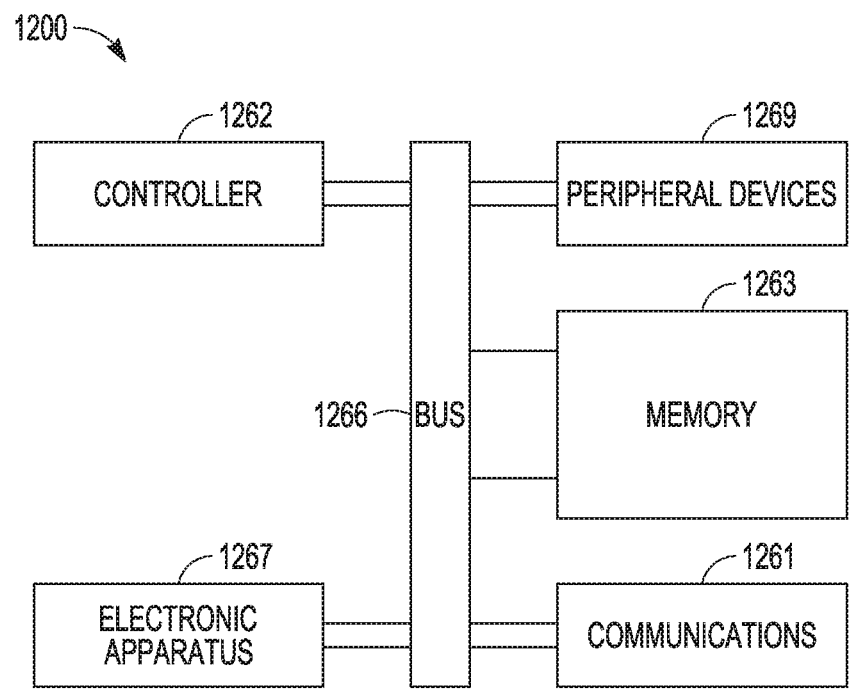
FIG. 12 shows a block diagram of a system that includes a memory structured as a three-dimensional memory device, according to various embodiments.

FIG. 12 shows a block diagram of a system 1200 that includes a memory 1263 structured as a 3D memory device having a number of memory cells disposed in a number of pillars between lower and upper digitlines with sense amplifiers to provide read/write operations and refresh operations, arranged as taught herein. Memory 1263 structured as a 3D memory device may be structured to include an array of memory cells that share a sense amp and digitline with a SRAM cache formed below the array of memory cells in the same die. The device architectures of memory 1263 can be realized in a manner similar to or identical to structures in accordance with various embodiments discussed herein.

System 1200 can include a controller 1262 operatively coupled to memory 1263. Controller 1202 can be in the form or one or more processors. System 1200 can also include an electronic apparatus 1267, peripheral devices 1269, and a communications module 1261. One or more of controller 1262, memory 1263, electronic apparatus 1267, peripheral devices 1269, and communications module 1261 can be in the form of one or more ICs.

A bus 1266 provides electrical conductivity between and/or among various components of system 1200. In an embodiment, bus 1266 includes an address bus, a data bus, and a control bus, each independently configured. In an alternative embodiment, bus 1266 uses common conductive lines for providing one or more of address, data, or control, the use of which is regulated by controller 1202. Bus 1266 can include components of a communications network.

Electronic apparatus 1267 may include additional memory. Such additional memory in system 1200 may be constructed as one or more types of memory such as, but not limited to, DRAM, SRAM, synchronous dynamic random access memory (SDRAM), synchronous graphics random access memory (SGRAM), double data rate dynamic ram (DDR), double data rate SDRAM, magnetic based memory, or other emerging memory cell technology.

Peripheral devices 1269 may include displays, imaging devices, printing devices, wireless devices, additional storage memory, and control devices that may operate in conjunction with controller 1262. In various embodiments, system 1200 can include, but is not limited to, fiber optic systems or devices, electro-optic systems or devices, optical systems or devices, imaging systems or devices, and information handling systems or devices such as wireless systems or devices, telecommunication systems or devices, and computers.

Structural designs for 3D DRAMs, as taught herein, can provide for very fast loading of cache memory, up to 10 peta bps. Even though the cache is on the die with the DRAM, utilization of the cache enables access of data much faster than from the DRAM directly. This may nearly eliminate need for a system to perform refresh, since it can be performed by the die in the background, but this can cost power. With hierarchical digitlines, the number of sense amp can be much fewer and digitline capacitance can be less than for planar structures, but enables 3D DRAM access device leakage, which can be addressed by more refresh cycles.

A 3D DRAM may be approximately 70% the cost and approximately 70% the die size as compared to some conventional planar DRAMs and may enable at least three to four die shrinks of approximately 30% each. Architectural structures, as taught herein, can overcome the obstacle access device leakage for 3D DRAM, allowing fifty times the leakage while at the same time removing system overhead for refresh. In various embodiments of architectures with SRAM added under the memory array can enable high speed SRAM cache loading. The SRAM can be constructed under the memory array, since space is available and the SRAM may be located behind the sense amp under the memory array.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. A memory device comprising:
    an array of memory cells, the array being a three-dimensional array of pillars with each pillar having memory cells stacked vertically in the pillar, a number of the pillars arranged along a horizontal direction;
    a first digitline disposed below the array, the first digitline coupled to each pillar of the pillars along the horizontal direction by a respective first select device;
    a second digitline above the array, the second digitline coupled to each pillar of the pillars along the horizontal direction by a respective second select device;
    a first sense amplifier coupled to the first digitline;
    a second sense amplifier coupled to the second digitline; and
    an input/output circuit coupled to the first sense amplifier or the second sense amplifier.

2. The memory device of claim 1, wherein the memory device includes control circuitry to access a first memory cell in one pillar of the pillars along the horizontal direction via an access line coupled to the first memory cell and via one of the first digitline or the second digitline coupled to the one pillar and to access a second memory cell in another pillar of the pillars along the horizontal direction via an access line coupled to the second memory cell and via the other one of the first digitline or the second digitline.

3. The memory device of claim 2, wherein the control circuitry is operable to control the access to the first memory cell and the access to the second memory cell in time intervals that overlap.

4. The memory device of claim 1, wherein each of the memory cells in each pillar is a dynamic random access memory cell coupled to a pillar digitline of the respective pillar, the pillar digitline coupled to the respective first select device to the respective second select device of the respective pillar.

5. The memory device of claim 1, wherein the memory device includes a static random access memory structured to store a bit from a memory cell of each of a selected number of pillars of the pillars along the horizontal direction, the static random access memory integrated in a die with the array of memory cells.

6. The memory device of claim 5, wherein the static random access memory is structured below the array of memory cells.

7. The memory device of claim 6, wherein the memory device includes a processor disposed in the die below the array of memory cells to control the static random access memory.

8. The memory device of claim 1, wherein the memory device includes a second input/output circuit coupled to the first sense amplifier or the second sense amplifier not coupled to the input/output circuit.

9. A memory device comprising:
- an array of memory cells in a die, the array being a three-dimensional array of pillars with each pillar having memory cells stacked vertically in the pillar, a number of the pillars arranged along a horizontal direction;
- a digitline disposed below the array or above the array, the digitline coupled to each pillar of the pillars along the horizontal direction by a respective select device coupled to a pillar digitline of the respective pillar;
- a static random access memory cache integrated in the die with the array of memory cells and disposed below the array of memory cells;
- a sense amplifier coupled to the digitline; and
- an input/output circuit coupled to the sense amplifier.

10. The memory device of claim 9, wherein the memory device is arranged to read data from the array into the static random access memory cache and to write the data back to the array.

11. The memory device of claim 10, wherein the memory device is operable at rates to read the data from the array into the static random access memory cache at approximately 10 petabps and write the data back to the array in an interval from about 5 petabps to about 10 petabps.

12. The memory device of claim 9, wherein the array and the static random access memory cache share the digitline and the sense amplifier.

13. The memory device of claim 9, wherein the memory device includes a processor disposed in the die below the array of memory cells to control the static random access memory.

14. A method comprising:
- writing or reading data to or from a memory cell of an array of memory cells using a first digitline coupled to a first sense amplifier, the array being a three-dimensional array of pillars with each pillar having memory cells stacked vertically in the respective pillar, a number of the pillars arranged along a horizontal direction; and
- refreshing a memory cell, in a pillar different from a pillar containing the memory cell to which the data is written or read, using a second digitline coupled to a second sense amplifier, wherein one of the first digitline and the second digitline is disposed below the array and the other of the first digitline and the second digitline is disposed above the array.

15. The method of claim 14, wherein the method includes continuously refreshing memory cells in pillars different from a pillar in which data is being read from or written to a memory cell.

16. The method of claim 14, wherein writing or reading data includes reading one or more bits from one or more pillars of the array into a static random access memory disposed below the array of memory cells.

17. The method of claim 14, wherein the method includes storing a new cache page into a static random access memory cache disposed below the array of memory cells and, before loading the new page into the static random access memory cache, storing back to the array an existing page stored in the static random access memory cache.

18. A method comprising:
- writing or reading data into a static random access memory cache integrated in a die of a memory device with an array of memory cells and disposed below the array of memory cells, the array being a three-dimensional array of pillars with each pillar having memory cells stacked vertically in the pillar, a number of the pillars arranged along a horizontal direction, wherein the static random access memory cache and the array share a digitline and a sense amplifier coupled to the digitline to conduct storage operations.

19. The method of claim 18, wherein the method includes porting out the data from the static random access memory cache through the sense amplifier to input/output circuitry to transmit the data out of the memory device.

20. The method of claim 18, wherein the method includes storing a new cache page into the static random access memory cache and, before loading the new page into the static random access memory cache, storing hack to the array an existing page stored in the static random access memory cache.

* * * * *